United States Patent
Chuang et al.

(10) Patent No.: US 9,324,622 B2
(45) Date of Patent: Apr. 26, 2016

(54) SEMICONDUCTOR DEVICE AND METHOD OF FORMING THE SAME

(75) Inventors: Harry-Hak-Lay Chuang, Singapore (SG); Sin-Hua Wu, Zhubei (TW); Chung-Hau Fei, Hsin-Chu (TW); Ming Zhu, Singapore (SG); Bao-Ru Young, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 391 days.

(21) Appl. No.: 13/586,472

(22) Filed: Aug. 15, 2012

(65) Prior Publication Data
US 2014/0048886 A1    Feb. 20, 2014

(51) Int. Cl.
H01L 29/66    (2006.01)
H01L 21/8238    (2006.01)
H01L 21/265    (2006.01)
H01L 29/78    (2006.01)
H01L 29/165    (2006.01)

(52) U.S. Cl.
CPC .. *H01L 21/823807* (2013.01); *H01L 21/26506* (2013.01); *H01L 21/823814* (2013.01); *H01L 29/66628* (2013.01); *H01L 29/66636* (2013.01); *H01L 29/7843* (2013.01); *H01L 29/7847* (2013.01); *H01L 29/7848* (2013.01); *H01L 21/26586* (2013.01); *H01L 21/26593* (2013.01); *H01L 29/165* (2013.01); *H01L 29/6653* (2013.01)

(58) Field of Classification Search
CPC ...................... H01L 29/66636; H01L 29/7848
USPC .......................................................... 438/199
See application file for complete search history.

(56) References Cited

U.S. PATENT DOCUMENTS

| | | | |
|---|---|---|---|
| 2007/0032026 A1* | 2/2007 | Ong et al. | 438/301 |
| 2009/0108308 A1* | 4/2009 | Yang et al. | 257/288 |
| 2010/0148270 A1* | 6/2010 | Golonzka et al. | 257/369 |
| 2010/0164005 A1* | 7/2010 | Yu et al. | 257/369 |
| 2011/0070703 A1* | 3/2011 | Xiong et al. | 438/231 |
| 2011/0133287 A1* | 6/2011 | Jain | 257/368 |
| 2013/0146949 A1* | 6/2013 | Tsai et al. | 257/288 |
| 2013/0178029 A1* | 7/2013 | Wang et al. | 438/285 |

* cited by examiner

*Primary Examiner* — Peniel M Gumedzoe
*Assistant Examiner* — Christopher Johnson
(74) *Attorney, Agent, or Firm* — Slater & Matsil, L.L.P.

(57) ABSTRACT

A method of forming a semiconductor device includes forming a gate stack over a substrate, forming an amorphized region in the substrate adjacent to an edge of the gate stack, forming a stress film over the substrate, performing a process to form a dislocation with a pinchoff point in the substrate, removing at least a portion of the dislocation to form a recess cavity with a tip in the substrate, and forming a source/drain feature in the recess cavity.

20 Claims, 8 Drawing Sheets

SEMICONDUCTOR DEVICE AND METHOD OF FORMING THE SAME

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed.

For example, as semiconductor devices, such as metal-oxide-semiconductor field-effect transistors (MOSFETs), are scaled down through various technology nodes, strained source/drain features (e.g., stressor regions) have been implemented to enhance carrier mobility and improve device performance. Although existing approaches to forming stressor regions for IC devices have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
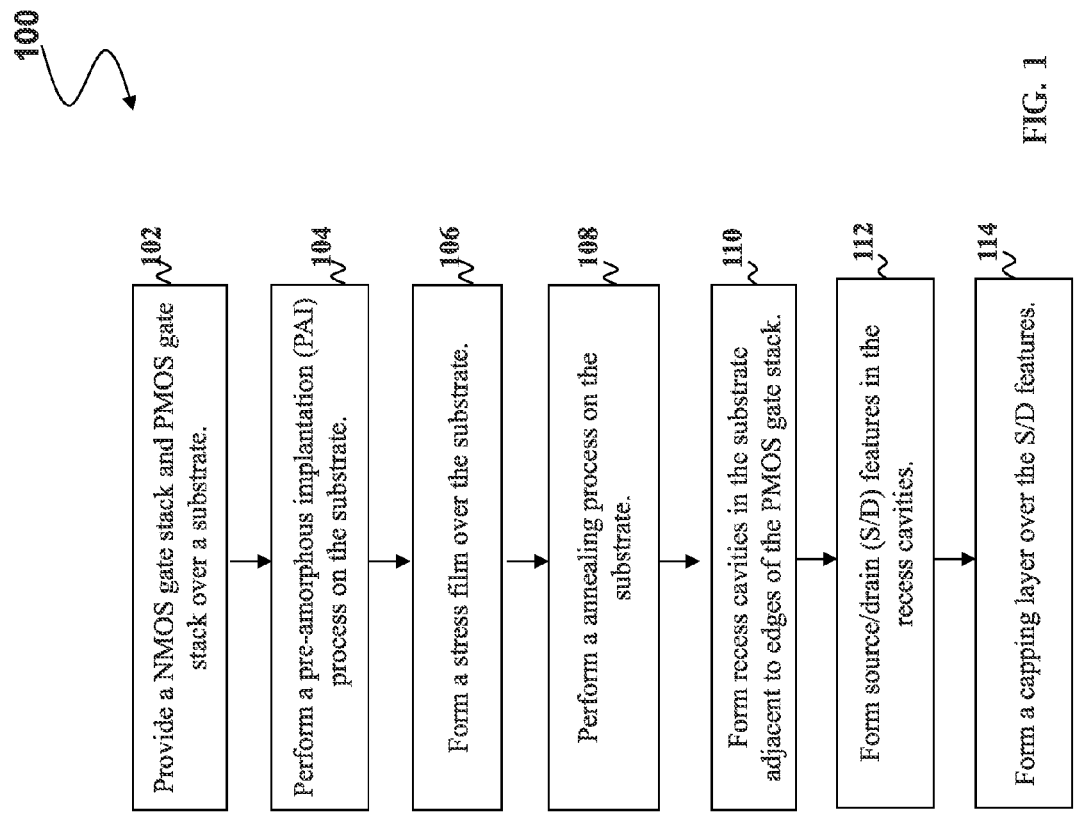
FIG. 1 is a flowchart illustrating a method of forming a semiconductor device according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. It is understood that those skilled in the art will be able to devise various equivalents that, although not explicitly described herein, embody the principles of the present invention.

Examples of devices that can benefit from one or more embodiments of the present invention are semiconductor devices with field effect transistors (FET). Such a device, for example, is a complementary metal-oxide-semiconductor (CMOS) field effect transistor. The following disclosure will continue with this example to illustrate various embodiments of the present application. It is understood, however, that the present application should not be limited to a particular type of device, except as specifically claimed.

With reference to FIGS. 1 and 2-8, a method 100 and a semiconductor device 200 are collectively described below. The semiconductor device 200 refers to an integrated circuit, or a portion thereof, that can comprise active devices such as metal-oxide-semiconductor field effect transistors (MOSFETs), complementary metal-oxide-semiconductor (CMOS) transistors, high voltage transistors, and/or high frequency transistors; other suitable components; and/or combinations thereof. The semiconductor device 200 may additionally include passive components, such as resistors, capacitors, inductors, and/or fuses. It is understood that the semiconductor device 200 may be formed by CMOS technology processing, and thus some processes are not described in detail herein. Additional steps can be provided before, during, or after the method 100, and some of the steps described below can be replaced or eliminated, for additional embodiments of the method. It is further understood that additional features can be added in the semiconductor device 200, and some of the features described below can be replaced or eliminated, for additional embodiments of the semiconductor device 200.

Referring to FIG. 1, a method 100 for fabricating a semiconductor device is described according to various aspects of the present disclosure. The method 100 begins with step 102 in which a NMOS gate stack and a PMOS gate stack are formed over a substrate. The method 100 continues with step 104 in which a pre-amorphous implantation (PAI) process is performed on the substrate. The method 100 continues at step 106 in which a stress film is deposited over the substrate. The method 100 continues at step 108 in which an annealing process is performed on the substrate. The method 100 continues at step 110 in which recess cavities are formed in the substrate and adjacent to edges of the PMOS gate stack. The method 100 continues at step 112 in which source/drain (S/D) features are formed in the recess cavities. The method 100 continues at step 114 in which a capping layer is formed over the source/drain features. The discussion that follows illustrates various embodiments of a semiconductor device 200 that can be fabricated according to the method 100 of FIG. 1.

Figure 2:
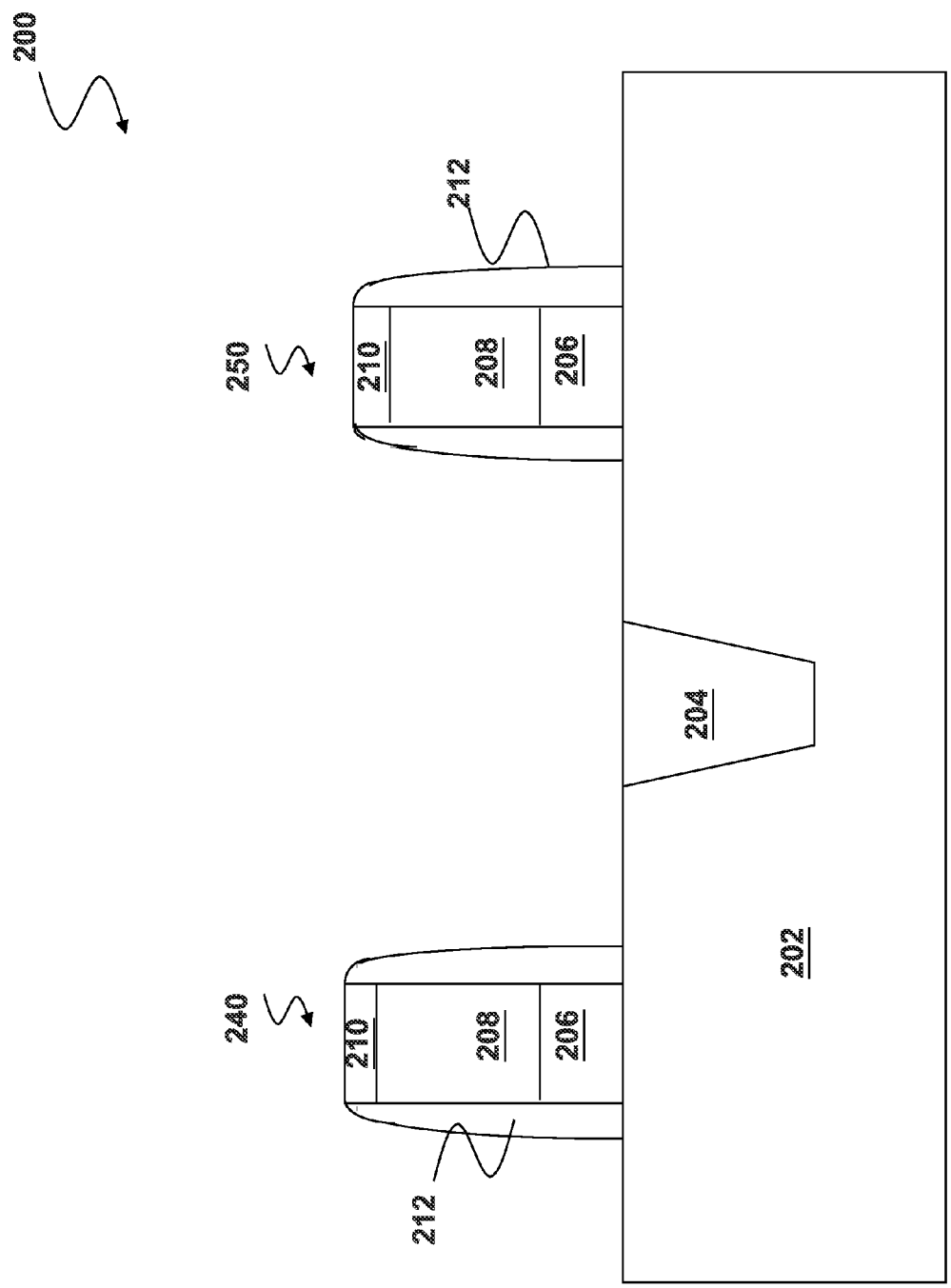
FIGS. 2 to 8 are cross-sectional side views of a semiconductor device at various stages of fabrication according to the method of FIG. 1 in accordance with one or more embodiments.

FIGS. 2 to 8 are cross-sectional side views of the semiconductor device 200 at various stages of fabrication according to the method 100 of FIG. 1. Referring to FIGS. 1 and 2, the method 100 begins at step 102, wherein a NMOS gate stack 240 and a PMOS gate stack 250 are formed over a substrate 202, and each of the NMOS gate stack 240 and the PMOS gate stack 250 defines a channel region of the substrate 202 thereunder. In the present embodiment, the substrate 202 is a semiconductor substrate including silicon. In some alternative embodiments, the substrate 202 includes an elementary semiconductor including silicon and/or germanium in crystal; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Where the substrate 202 is an alloy semiconductor, the alloy semiconductor substrate could have a gradient SiGe feature in which the Si and Ge composition change from one ratio at one location to another ratio at another location of the gradient SiGe feature. The alloy SiGe could be formed over a silicon substrate, and/or the SiGe substrate may be strained. In yet another alternative embodiment, the semiconductor substrate could be a semiconductor on insulator (SOI).

The substrate 202 includes various doped regions depending on design requirements as known in the art (e.g., p-type wells or n-type wells). The doped regions are doped with p-type dopants, such as boron or $BF_2$, and/or n-type dopants, such as phosphorus or arsenic. The doped regions may be formed directly on the substrate 202, in a P-well structure, in an N-well structure, in a dual-well structure, or using a raised structure. The substrate 202 can include an isolation feature 204 to define and isolate various active regions of the substrate 202. The isolation feature 204 utilizes isolation technology, such as shallow trench isolation (STI) or local oxidation of silicon (LOCOS), to define and electrically isolate the various regions. The isolation feature 204 includes silicon oxide, silicon nitride, silicon oxynitride, other suitable materials, or combinations thereof.

Still referring to FIG. 2, in some embodiments, the NMOS gate stack 240 and the PMOS gate stack 250 are formed by sequentially depositing and patterning a gate dielectric layer 206, a gate electrode layer 208, and a hard mask layer 210 on the substrate 202. The gate dielectric layer 206, in one example, is a thin film comprising silicon oxide, silicon nitride, silicon oxynitride, high-k dielectrics, other suitable dielectric materials, or combinations thereof. High-k dielectrics comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof. In the present embodiment, the gate dielectric layer 206 is a high-k dielectric layer with a thickness in the range of about 10 angstroms to about 30 angstroms. The gate dielectric layer 206 may be formed using a suitable process such as atomic layer deposition (ALD), chemical vapor deposition (CVD), physical vapor deposition (PVD), thermal oxidation, UV-ozone oxidation, or combinations thereof. The gate dielectric layer 206 may further comprise an interfacial layer (not shown) to reduce damage between the gate dielectric layer 206 and the substrate 202. The interfacial layer may comprise silicon oxide.

The gate electrode layer 208 is then formed on the gate dielectric layer 206. In some embodiments, the gate electrode layer 208 includes a single layer or multilayer structure. In the present embodiment, the gate electrode layer 208 comprises polysilicon. Further, the gate electrode layer 208 may be doped polysilicon with the same or different doping species. In one embodiment, the gate electrode layer 208 has a thickness in the range of about 30 nm to about 60 nm. The gate electrode layer 208 may be formed using a process such as low-pressure chemical vapor deposition (LPCVD), plasma enhanced chemical vapor deposition (PECVD), other suitable processes, or combinations thereof. Next, the hard mask layer 210 is formed over the gate electrode layer 208 and a patterned photo-sensitive layer (not shown) is formed on the hard mask layer 210. The pattern of the photo-sensitive layer is transferred to the hard mask layer 210 and then transferred to the gate electrode layer 208 and the gate dielectric layer 206 to form the NMOS gate stack 240 and the PMOS gate stack 250. In some embodiments, the hard mask layer 210 includes silicon oxide. In alternative embodiments, the hard mask layer 210 includes silicon nitride, silicon oxynitride, and/or other suitable dielectric materials, and may be formed using a method such as CVD or PVD. The hard mask layer 210 has a thickness in the range from about 100 angstroms to about 800 angstroms. The photo-sensitive layer is removed thereafter by a dry and/or wet stripping process.

With further referring to FIG. 2, sidewall spacers (or referred to gate spacers) 212 are formed adjoining opposite sidewalls of the NMOS gate stack 240 and the PMOS gate stack 250. In some embodiments, the sidewall spacers 212 include a single-layer or a multiple-layer structure. In the present embodiment, a blanket layer of spacer material (not shown) is formed over the NMOS gate stack 240, the PMOS gate stack 250, and the substrate 202 by a depositing process including CVD, PVD, ALD, or other suitable techniques. In some embodiments, the spacer material comprises silicon oxide, silicon nitride, silicon oxy-nitride, other suitable material, or combinations thereof. In some embodiments, the deposited layer of spacer material has a thickness ranging from about 10 angstroms to about 60 angstroms. Then, an anisotropic etching process is performed on the spacer material to form the sidewall spacers 212. The sidewall spacers 212 can protect the sidewalls of the NMOS gate stack 240 and the PMOS gate stack 250. Alternatively, the sidewall spacers 212 can be used to offset subsequently formed doped regions, such as heavily doped source/drain regions.

Figure 3:
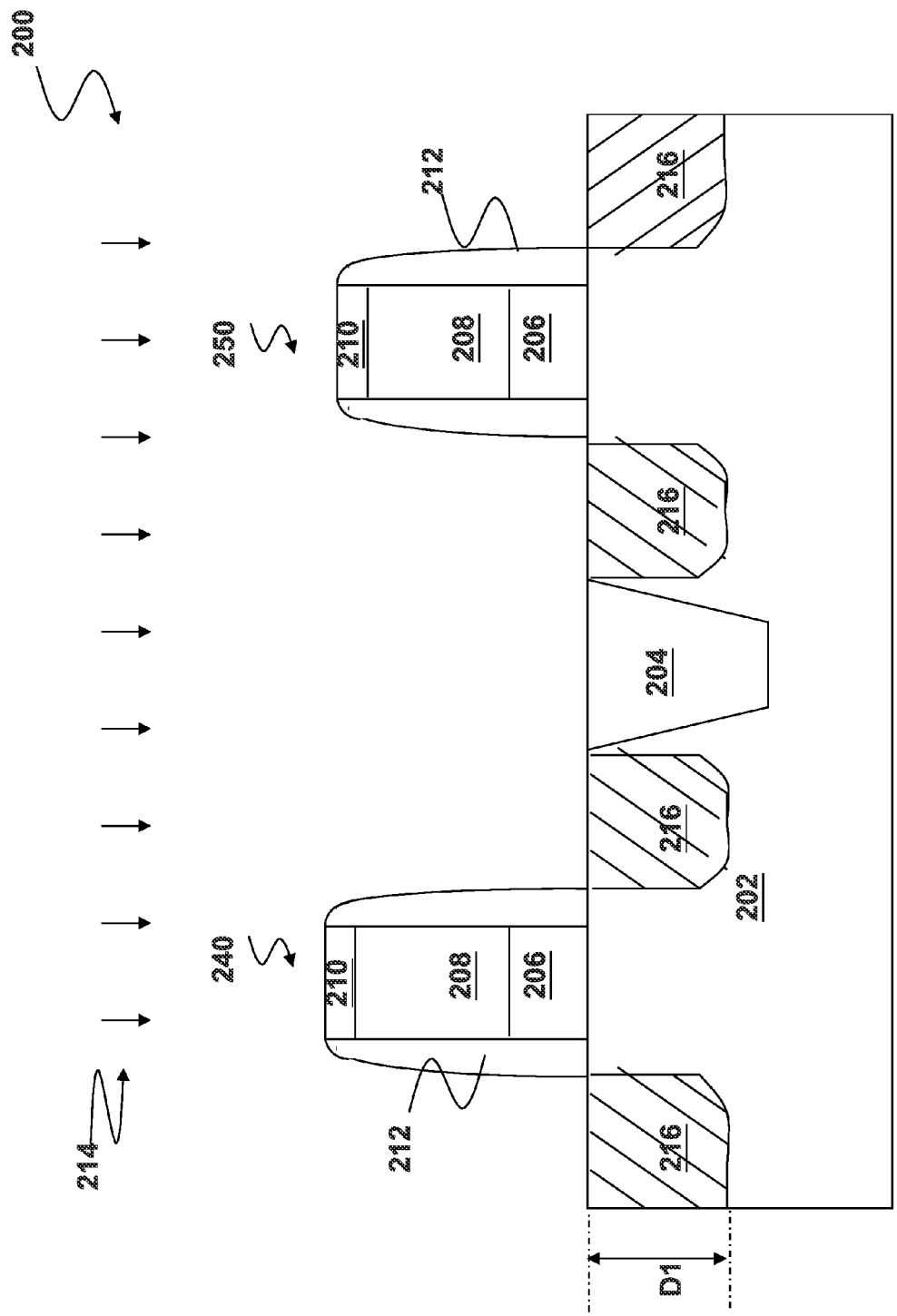

Referring to FIGS. 1 and 3, the method 100 proceeds to step 104, wherein a pre-amorphous implantation (PAI) process 214 is performed on the substrate 202. In some embodiments, the PAI process 214 implants the substrate 202 and causes damage to the lattice structure of the substrate 202 to form amorphized regions 216. In the present embodiment, the amorphized regions 216 are formed in source/drain (S/D) regions of the semiconductor device 200. The amorphized regions 216 have a depth D1 (measured from an upper surface of the substrate 202). The depth D1 is formed according to design specifications. The depth D1, in some embodiments, ranges from about 10 nanometers to about 150 nanometers. In the present embodiment, the depth D1 is less than about 100 nanometers. The depth D1 can be controlled by the thickness of the sidewall spacers 212 because the sidewall spacers 212 serve to concentrate the PAI process 214 implantation energy. Also, the depth D1 can be controlled by the PAI process 214, such as implant energy, implant species, and/or implant dosage. In at least one embodiment, the PAI process 214 implants the substrate 202 with silicon (Si) or germanium (Ge). In an alternative embodiment, the PAI process 214 could utilize other implant species, such as Ar, Xe, C, $BF_2$, As, In, other suitable implant species, or combinations thereof. In the present embodiment, the PAI process 214 implants Si or Ge at an implant energy ranging from about 15 KeV to about 50 KeV, and an implant dosage ranging from about $1 \times 10^{14}$ atoms/cm$^2$ to about $2 \times 10^{15}$ atoms/cm$^2$, depending on the implantation temperature. In at least one embodiment, the PAI process 214 is performed at room temperature (e.g. 25° C.). In an alternative embodiment, the PAI process 214 is performed at a low temperature (e.g., −60° C. to −100° C.) by adapting a Cryo (low temperature) function in the ion implanter to enhance the efficiency of implant amorphization. In some embodiments, the PAI process 214 is performed with a tilt angle ranging from about 0 degree to about 20 degrees.

In some alternative embodiments, the PAI process 214 can be a multiple-step implantation process, including at least a first step and a second step of the implantation process. The first and the second steps of the implantation process are performed using a first and a second implant energy levels, a first and a second implant dosages, and a first and a second implant tilt angles, respectively. In at least one embodiment, the first and the second implant energy levels range from about 15 KeV to about 50 KeV. In anther embodiment, the first implant energy level is greater than the second implant energy level. In at least one embodiment, the first and the second implant dosages range from about $1 \times 10^{14}$ atoms/cm$^2$ to about $2 \times 10^{15}$ atoms/cm$^2$. In anther embodiment, the first implant dosage is greater than the second implant dosage. In some embodiments, a combined dosage of the first and the second implant dosages range from about $1 \times 10^{14}$ atoms/cm$^2$ to about $2 \times 10^{15}$ atoms/cm$^2$, and a ratio between the first and the second implant dosages ranges from about 1:1 to about 7:3. In one embodiment, the first and the second tilt angles range from about 0 degree to about 20 degrees. In anther embodiment, the first implant tilt angle is greater than the second implant tilt angle.

In some embodiments, the amorphized regions 216 are formed adjacent to opposite edges of the NMOS gate stack 240 and opposite edges of the PMOS gate stack 250 without using any patterned photoresist layer or hard mask layer during the PAI process 214. Hence, a patterning process forming the patterned photoresist layer or the patterned hard mask layer may be saved, thereby minimizing cost as no additional photoresist layer or hard mask is required for the PAI process 214.

Figure 4:
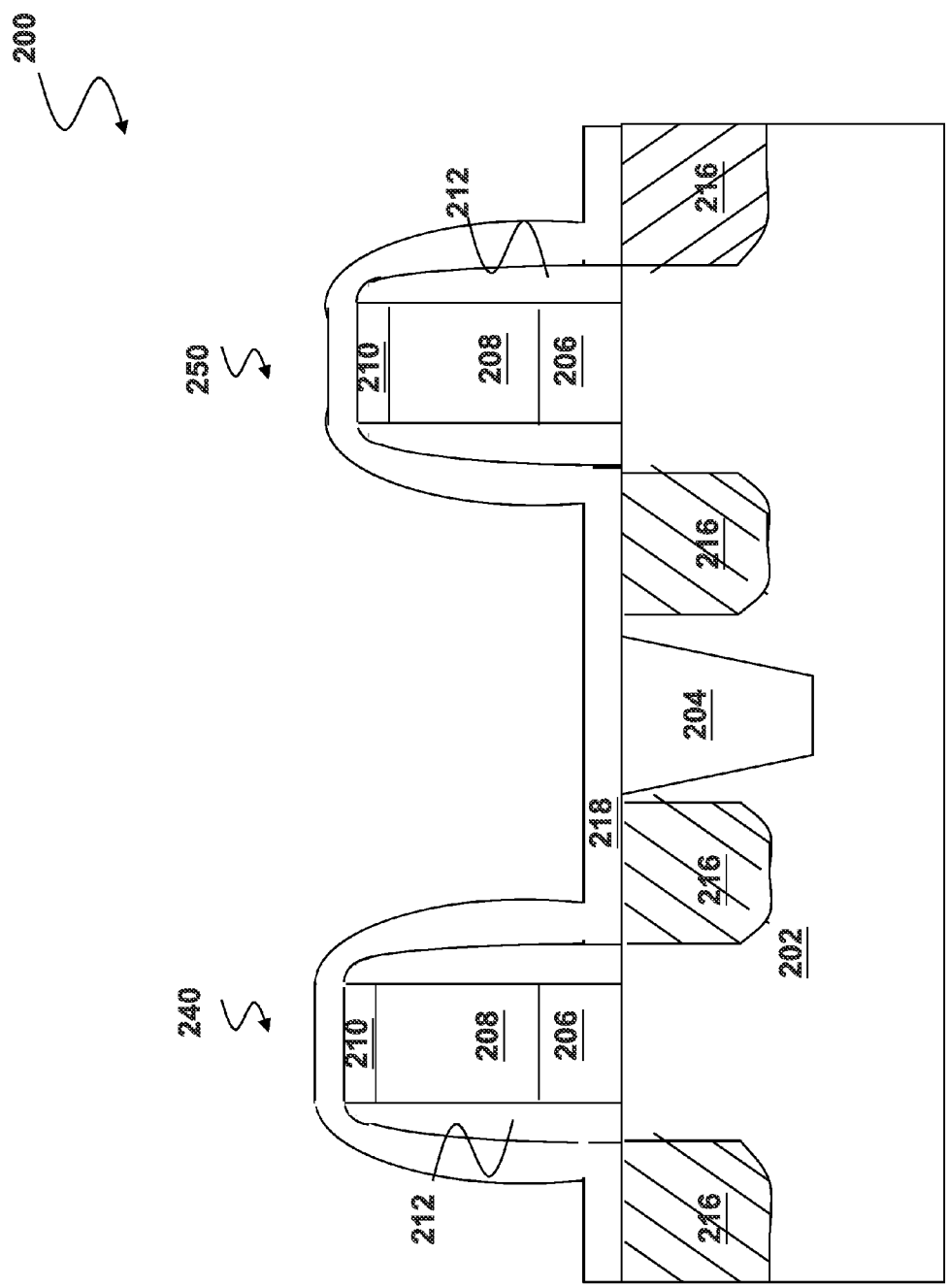

Referring to FIGS. 1 and 4, the method 100 proceeds to step 106 wherein a stress film 218 is deposited over the NMOS gate stack 240, the PMOS gate stack 250, and the substrate 202. The stress film 218 may be formed by chemical vapor deposition (CVD), physical vapor deposition (PVD), atomic layer deposition (ALD), high density plasma CVD (HDPCVD), plating, other suitable methods, and/or combinations thereof. The stress film 218 includes a dielectric material. In some embodiments, the stress film 218 includes silicon nitride, silicon oxynitride, SiCN, and/or combinations thereof. In alternative embodiments, the stress film 218 includes silicon oxide. In some embodiments, the stress film 218 has a thickness greater than the thickness of the spacer material for forming the sidewall spacers 212. In some embodiments, the stress film 218 has a thickness ranging from about 100 angstroms to about 300 angstroms. In some embodiments, the stress film 218 is used to provide tensile stress in a subsequent annealing process which recrystallizes the amorphized regions 216.

Figure 5:
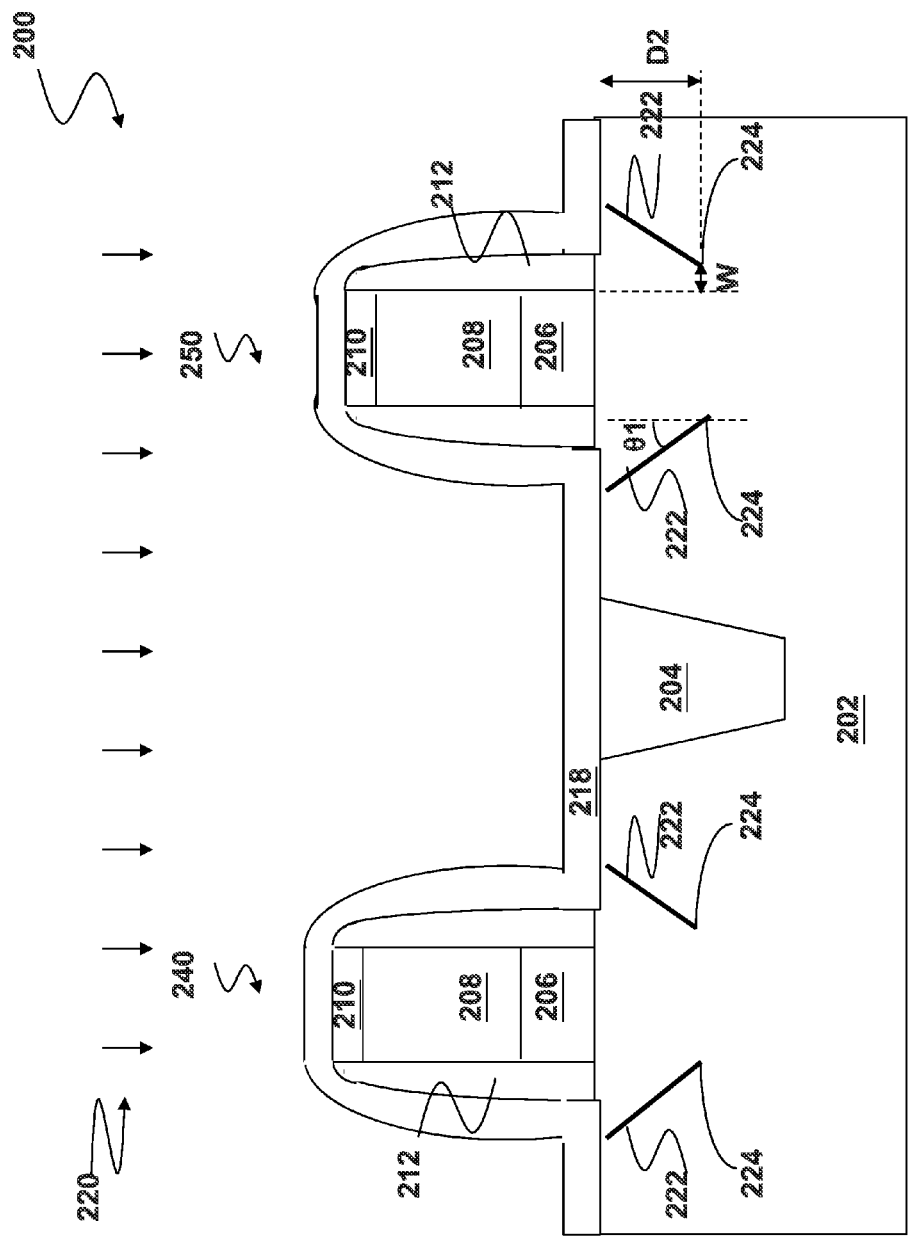

Referring to FIGS. 1 and 5, the method 100 proceeds to step 108 wherein an annealing process 220 is performed on the substrate 202. In some embodiments, the annealing process 220 is a rapid thermal annealing (RTA) process, spike RTA process, or a millisecond thermal annealing (MSA) process (e.g., millisecond laser thermal annealing process). In at least one embodiment, the annealing process 220 includes an RTA process performed at a temperature ranging from about 600° C. to about 750° C., lasting for a period of time ranging from about 10 seconds to about 5 minutes. In an alternative embodiment, the annealing process 220 includes a spike RTA process performed at a temperature ranging from about 990° C. to about 1050° C., lasting for a period of time ranging from about 0.1 seconds to about 2 seconds. In alternative embodiments, the annealing process 220 may further include a pre-heat step to minimize (or even eliminate) the end of range (EOR) defects. In some embodiments, the pre-heat step may be performed at a temperature ranging from about 400° C. to about 700° C. In some embodiments, the pre-heat step may be performed for a period of time ranging from about 10 seconds to about 5 minutes. In the present embodiment, the pre-heat step is performed at a temperature of about 550° C. lasting for about 30 seconds.

During the annealing process 220, as the amorphized regions 216 become re-crystallized, dislocations 222 of the re-crystallized counterpart of the amorphized regions 216 are formed in the substrate 202. In some embodiments, the dislocations 222 are formed adjacent to edges of the NMOS gate stack 240 and edges of the PMOS gate stack 250. In some embodiments, the substrate 202 is referred to as a (100) substrate and the dislocations 222 are formed along a <111> direction. In some embodiments, the <111> direction has an angle θ1, measured with respect to a reference level orthogonal to the surface of the substrate 202, ranging from about 25 degrees to about 45 degrees. In the present embodiment, the dislocations 222 have <111> direction with the angle θ1 of about 35 degrees. The dislocations 222 are formed starting at pinchoff points 224. The pinchoff points 224 have a depth D2 measured from the upper surface of the substrate 202. In some embodiments, the depth D2 of the pinchoff points 224 ranges from about 10 nanometers to about 150 nanometers. In the present embodiment, the depth D2 of the pinchoff points 224 ranges from about 10 nanometers to about 30 nanometers. The pinchoff points 224 have a horizontal buffer (proximity) W measured from an adjacent gate edge of the NMOS gate stack 240 or the PMOS gate stack 250. The horizontal buffer W and the depth D2 are formed according to design specifications and are a function of the annealing process 220. In some embodiments, the horizontal buffer W of the pinchoff points 224 ranges from about −5 nanometers to about 10 nanometers ("-" represents the pinchoff points 224 are under the NMOS gate stack 240 or the PMOS gate stack 250.). The pinchoff points 224 may be formed such that they are not disposed within the channel region in the substrate 202 defined by the NMOS gate stack 240 or the PMOS gate stack 250.

Figure 6:
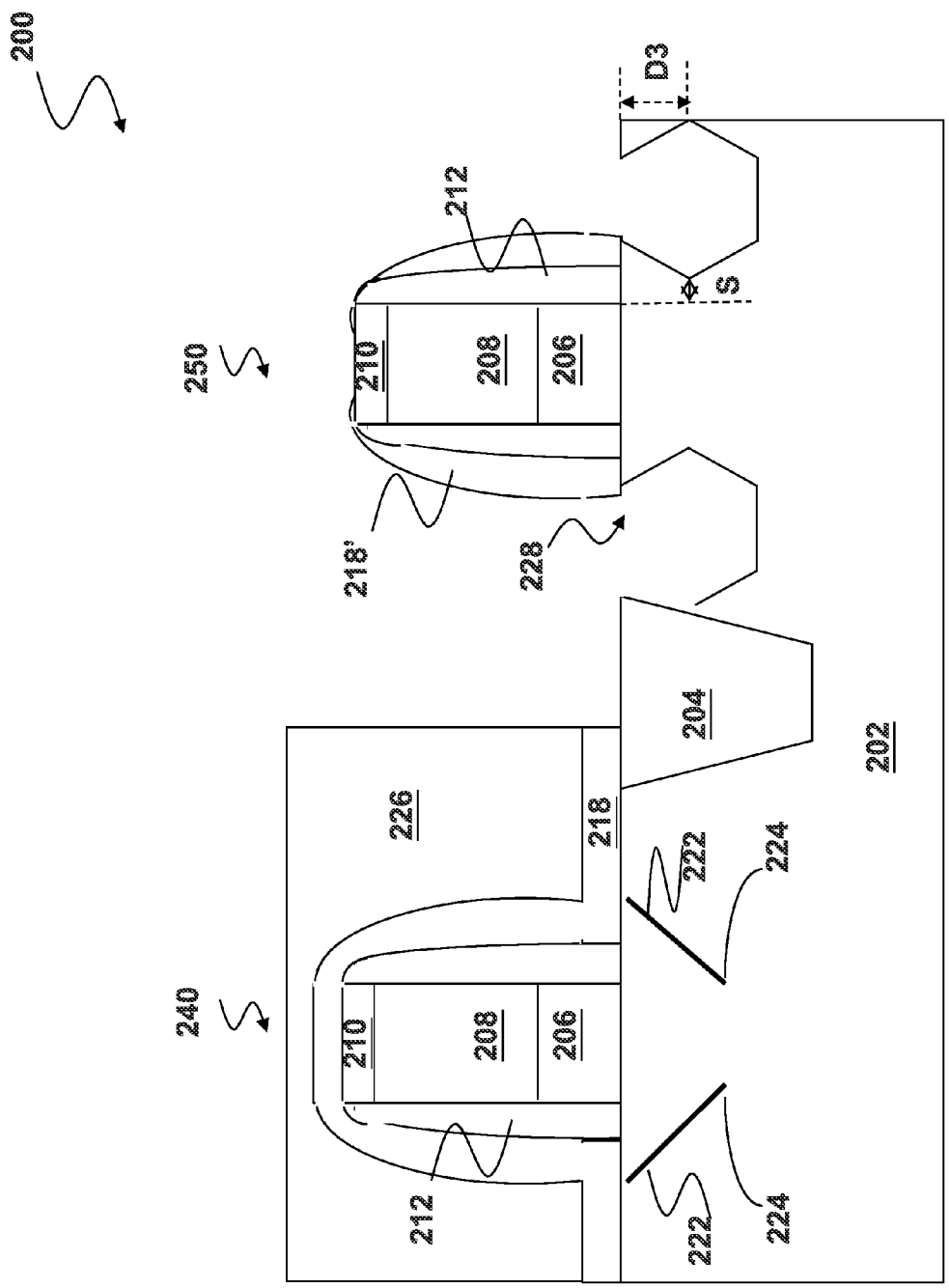

Referring to FIGS. 1 and 6, the method 100 proceeds to step 110 wherein recess cavities 228 are formed in the substrate 202. In some embodiments, the recess cavities 228 are adjacent to opposite edges of the PMOS gate stack 250. In some embodiments, the recess cavities 228 are source and drain (S/D) recess cavities for the PMOS gate stack 250. In the present embodiment, the processes for forming the recess cavities 228 include etching processes started using an isotropic dry etching process, followed by an anisotropic wet or dry etching process. In some embodiments, a protector 226 is provided to cover the NMOS gate stack 240, thereby preventing the substrate 202 adjacent to the NMOS gate stack 240 being removed by the etching process. The protector 226, for example, is a photoresist pattern.

In some embodiments, the isotropic dry etching process is performed to remove the portion of the stress film 218 overlying the substrate 202 and adjacent to the PMOS gate stack 250 to expose the underlying substrate 202. Then, the exposed substrate 202 is recessed to form initial recess cavities (not shown) adjacent to edges of the PMOS gate stack 250. In an embodiment, the isotropic dry etching process may be performed under a pressure of about 1 mTorr to about 1000 mTorr, a power of about 50 W to about 1000 W, a bias voltage of about 20 V to about 500 V, at a temperature of about 40° C. to about 60° C., using HBr and/or Cl$_2$ as etch gases. Also, in the embodiments provided, the bias voltage used in the isotropic dry etching process may be tuned to allow better control of an etching direction to achieve desired profiles for the S/D recess regions. In some embodiments, a portion of the stress film 218 adjoining exterior surfaces of the sidewall spacers 212 of the PMOS gate stack 250 is left to form spacers 218'. The spacers 218' may function as protectors for the sidewalls of the PMOS gate stack 250 in a subsequent epitaxy growth process.

In some embodiments, a wet etching process is then provided to enlarge the initial recess cavities to form the recess cavities 228. In some embodiments, the wet etching process is performed using a chemical including hydration tetramethyl ammonium (TMAH), or the like. In some embodiments, the recess cavities 228 are wedge-shaped with tips extend into the substrate 202 and toward the channel region under the PMOS gate stack 250. A spacing S between a sidewall of the PMOS gate stack 250 and an adjacent tip is identified as proximity of the tip. A depth D3 is measured vertically from the surface of the substrate 202 to the tip. A correlation between the angle θ1 of the dislocations 222, the horizontal buffer W, the depth D2 of the pinchoff points 224, the spacing S of the proximity of the tip, and the depth D3 of the tip is required according to design specifications. In some embodiments, the correlation is satisfied to ensure the dislocations 222 adjacent to the edges of the PMOS gate stack 250 are completely removed by the etching process. In some embodiments, the correlation satisfies the following formula, W>|D2−D3|*tan θ1+S. Thereafter, the protector 226 is removed by, for example, a wet stripping and/or $O_2$ plasma process.

Figure 7:
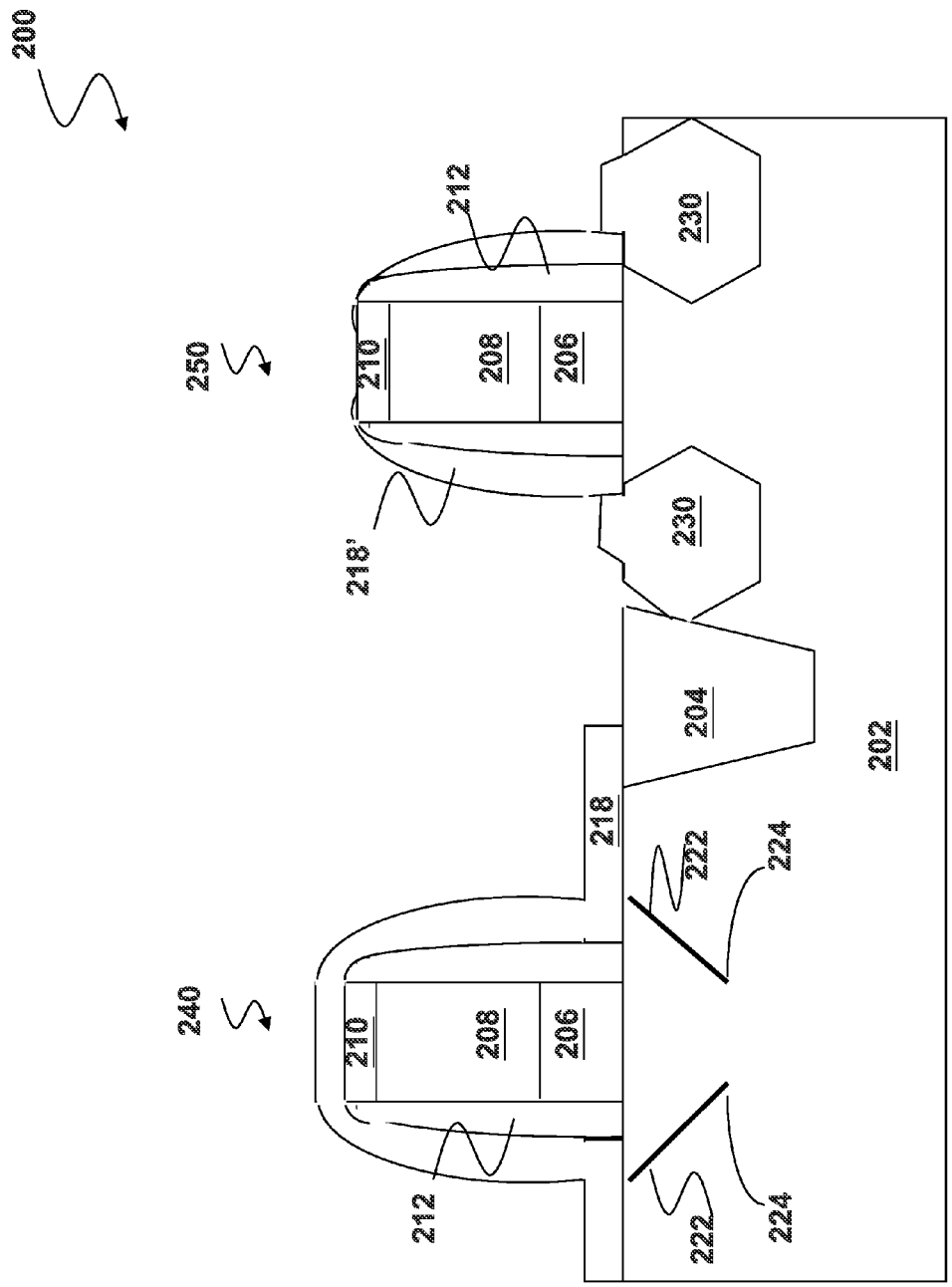

Referring to FIGS. 1 and 7, the method 100 proceeds to step 112 wherein source/drain (S/D) features 230 are formed in the recess cavities 228 of the substrate 202. In some embodiments, the source/drain features 230 have a top surface higher than the top surface of the substrate. In some embodiments, the source/drain features 230 has a top surface higher than the top surface of the substrate 202 with a height difference ranging between about 1 nm and about 10 nm. In alternative embodiments, the source/drain features 230 have a top surface substantially coplanar with the top surface of the substrate 202. In some embodiments, the source/drain features 230 include a strained material grown in the recess cavities 228 using a process including selective epitaxy growth (SEG), cyclic deposition and etching (CDE), chemical vapor deposition (CVD) techniques (e.g., vapor-phase epitaxy (VPE) and/or ultra-high vacuum CVD (UHV-CVD)), molecular beam epitaxy (MBE), other suitable epi processes, or combinations thereof. In some embodiments, the strained material has a lattice constant different from the substrate 202 to induce a strain or stress on the channel region of the semiconductor device 200, and therefore enable carrier mobility of the device to enhance the device performance.

In the present embodiment, a pre-cleaning process is performed to clean the recess cavities 228 using a chemical comprising hydrofluoric acid (HF) or other suitable solution. Then, gaseous and/or liquid precursors may be provided to interact with the composition of the substrate 202 to form the strained material, such as silicon germanium (SiGe), to fill the recess cavities 228. In one embodiment, the process for forming the strained material comprising SiGe is performed at a temperature of about 600° to 750° C. and under a pressure of about 10 Torr to about 80 Torr, using reaction gases comprising $SiH_2Cl_2$, HCl, $GeH_4$, $B_2H_6$, $H_2$, or combinations thereof. In some embodiments, a ratio of a mass flow rate of the $SiH_2Cl_2$ to a mass flow rate of the HCl is in the range of about 0.45 to 0.55.

In some embodiments, the growth of the strained material in the recess cavities 228 not adjacent to the isolation structure 204 is mainly parallel to the crystal plane of the top surface of the substrate 202. In the present embodiment, the strained materials in the recess cavities 228 not adjacent to the isolation structure 204 have an upper surface formed of the (100) crystal plane. In the present embodiment, the growth of the strained material in the recess cavities 228 adjacent to the isolation structure 204 is limited by the isolation structure 204 because the isolation structure 204 formed by silicon oxide fails to offer nucleation sites to grow an epitaxial material. In some embodiments, the growth of the strained material in the recess cavities 228 adjacent to the isolation structure 204 tends to have an upper surface not entirely parallel to the crystal plane of the top surface of the substrate 202. In some embodiments, the growth of the strained material in the recess cavities 228 adjacent to the isolation structure 204 tends to have an upper surface formed of (111) crystal plane with a stable surface energy.

Figure 8:
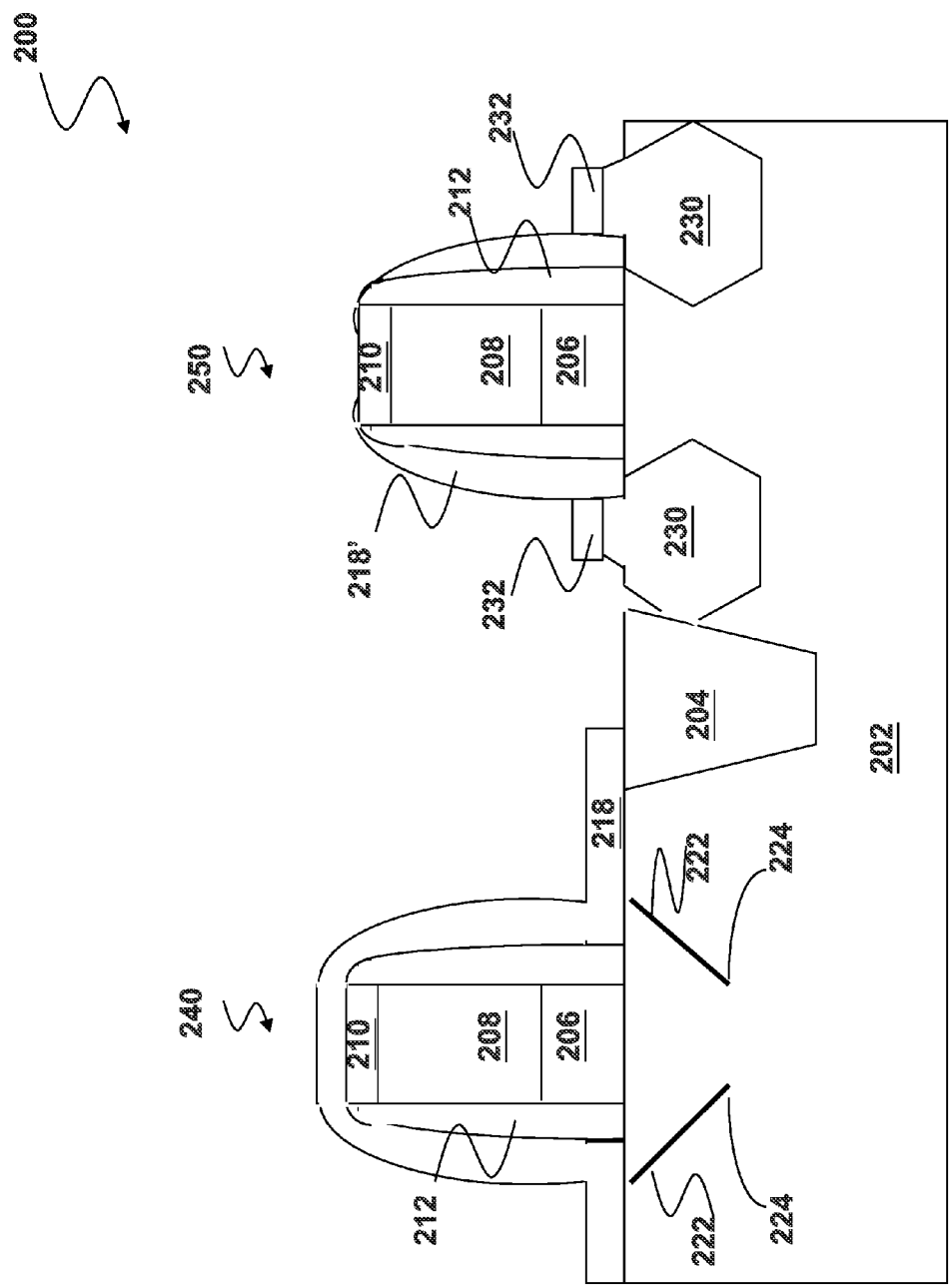

Referring to FIGS. 1 and 8, the method 100 proceeds to step 114 wherein a capping layer 232 is formed over the source/drain (S/D) features 230. The capping layer 232 may function as a protection layer to prevent the underlying strained material from being over-etched in a subsequent etching process. In the present embodiment, the capping layer 232 is formed by an epi growth process. In some embodiments, the capping layer 232 has a thickness ranging between about 1 nm and about 5 nm. In some embodiments, the capping layer 232 over the strained material in the recess cavities 228 may grow along the crystal orientation of the upper surface of the strained material. In some embodiments, the growth of the capping layer 232 over the strained material not adjacent to the isolation structure 204 tends to have an upper surface formed of (100) crystal plane. In some embodiments, the growth of capping layer 232 over the strained material in the recess cavities 228 adjacent to the isolation structure 204 tends to have an upper surface formed of (111) crystal plane.

Thereafter, in some embodiments, the remained stress film 218 (i.e., the portion that was not removed) over the NMOS gate stack 240 and the spacers 218' adjoining exterior surfaces of the sidewall spacers 212 of the PMOS gate stack 250 are removed. The remained stress film 218 and the spacers 218' are removed, for example, by a wet etching using phosphoric acid or hydrofluoric acid, or by a dry etching using suitable etchant.

A benefit of the dislocations for the NMOS gate stack and the strained material for the PMOS gate stack, in accordance with the disclosed embodiments, is that the dislocations and the strained material formed within the active region (e.g., source/drain), may improve the stress within the channel region of the NMOS gate stack and the PMOS gate stack, respectively. Moreover, the process for forming the dislocations for the NMOS gate stack and the strained material for the PMOS gate stack may simplify the formation process, in accordance with the disclosed embodiments, thereby minimizing cost as no additional photoresist layer or hard mask is required. Thus, the disclosed embodiments provide increased stress level in the channel region to improve carrier mobility without adding significant cost to the manufacturing process and/or device. It is understood that different embodiments may have different advantages, and that no particular advantage is necessarily required of any embodiment.

The semiconductor device may undergo further CMOS or MOS technology processing to form various features. For example, the method 100 may proceed to form main spacers. Contact features, such as silicide regions, may also be formed. The contact features include silicide materials, such as nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), other suitable conductive materials, and/or combinations thereof. The contact features can be formed by a process that includes depositing a metal layer, annealing the metal layer such that the metal layer is able to react with silicon to form silicide, and then removing the non-reacted metal layer. An inter-level dielectric (ILD) layer can further be formed on the substrate and a chemical mechanical polishing (CMP) process is further applied to the substrate to planarize the substrate. Further, a contact etch stop layer (CESL) may be formed on top of the gate structure before forming the ILD layer.

In an embodiment, the NMOS gate stack 240 and the PMOS gate stack 250 are formed of remaining polysilicon (e.g., polysilicon 208) in the final device. In another embodiment, a gate replacement process (or gate last process) is performed, where the polysilicon NMOS gate stack 240 and PMOS gate stack 250 are replaced with a metal gate. For example, a metal gate may replace the gate stack (i.e., polysilicon gate stack) of the NMOS gate stack 240 and the PMOS gate stack 250. The metal gate includes liner layers, work function layers, conductive layers, metal gate layers, fill layers, other suitable layers, and/or combinations thereof. The various layers include any suitable material, such as aluminum, copper, tungsten, titanium, tantalum, tantalum aluminum, tantalum aluminum nitride, titanium nitride, tantalum nitride, nickel silicide, cobalt silicide, silver, TaC, TaSiN, TaCN, TiAl, TiAlN, WN, metal alloys, other suitable materials, and/or combinations thereof.

Subsequent processing may further form various contacts/vias/lines and multilayer interconnect features (e.g., metal layers and interlayer dielectrics) on the substrate, configured to connect the various features or structures of the semiconductor device. The additional features may provide electrical interconnection to the device. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

The disclosed semiconductor device may be used in various applications such as digital circuits, imaging sensor devices, a hetero-semiconductor device, dynamic random access memory (DRAM) cells, a single electron transistor (SET), and/or other microelectronic devices (collectively referred to herein as microelectronic devices). Of course, aspects of the present disclosure are also applicable and/or readily adaptable to other type of transistor, including single-gate transistors, double-gate transistors, and other multiple-gate transistors, and may be employed in many different applications, including sensor cells, memory cells, logic cells, and others.

In one embodiment, a method of manufacturing a semiconductor device, includes forming a gate stack over a substrate, forming an amorphized region in the substrate adjacent to an edge of the gate stack, forming a stress film over the substrate, performing a process to form a dislocation with a pinchoff point in the substrate, removing at least a portion of the dislocation to form a recess cavity with a tip in the substrate, and forming a source/drain feature in the recess cavity. The amorphized region has a depth D1. The dislocation has an angle θ1 measured with respect to a reference level orthogonal to the surface of the substrate, a horizontal buffer W measured between the edge of the gate stack and the pinchoff point, and a depth D2. The recess cavity has a depth D3 and a horizontal space S measured between the edge of the gate stack and the tip.

In another embodiment, a method of manufacturing a semiconductor device, includes forming a first gate structure and a second gate structure over a substrate, forming a first amorphized region in the substrate adjacent to the first gate structure and a second amorphized region in the substrate adjacent to the second gate structure, depositing a stress film over the first and the second amorphized regions, performing an annealing process to form a first dislocation in the substrate adjacent to the first gate structure and a second dislocation in the substrate adjacent to the second gate structure, removing the second dislocation to form a recess cavity adjacent to the second gate structure while leaving the first dislocation adjacent to the first gate structure, and forming a source/drain feature in the recess cavity.

In still another embodiment, a semiconductor device, includes a semiconductor substrate, a first gate structure and a second gate structure over the semiconductor substrate, a dislocation with a pinchoff point in the semiconductor substrate and adjacent to an edge of the first gate structure, and a source/drain feature with a tip in the semiconductor substrate and adjacent to an edge of the second gate structure. The dislocation has an angle θ1 measured with respect to a reference level orthogonal to the surface of the substrate, a horizontal buffer W measured between the edge of the first gate structure and the pinchoff point, and a depth D2. The source/drain feature has a depth D3 and a horizontal space S measured between the edge of the second gate structure and the tip. The formula of $W > |D2-D3|*\tan(\theta 1)+S$ is satisfied.

The above disclosure provides many different embodiments, or examples, for implementing different features of the invention. Specific examples of components and arrangements are described above to simplify the present disclosure. These are, of course, merely examples and are not intended to be limiting. Accordingly, the components disclosed herein may be arranged, combined, or configured in ways different from the exemplary embodiments shown herein without departing from the scope of the present disclosure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
   forming a first gate stack and a second gate stack over a substrate, the substrate having a surface;
   forming a first amorphized region in the substrate adjacent to an edge of the first gate stack, wherein the first amorphized region has a depth D1, and forming a second amorphized region in the substrate adjacent to an edge of the second gate stack;
   forming a stress film over the substrate;
   performing a process to form a first dislocation with a first pinchoff point in the substrate, wherein the first dislocation forms an angle θ1 measured with respect to a reference level orthogonal to the surface of the substrate, and wherein the first pinchoff point is spaced from the edge of the first gate stack by a distance W and has a depth D2 relative the surface of the substrate, and to form a second dislocation having a second pinchoff point spaced from the edge of the second gate stack;
   removing at least a portion of the first dislocation to form a recess cavity with a tip in the substrate, wherein the recess cavity has a depth D3 relative the surface of the substrate and is spaced from the edge of the second gate stack by a distance S, while leaving the second dislocation intact;
   forming a source/drain feature in the recess cavity; and wherein a correlation satisfies the formula, $W>|D2-D3|*\tan(\theta 1)+S$.

2. The method of claim 1, further comprising:
removing at least a portion of the stress film to form spacers adjoining sidewalls of the first gate stack and the second gate stack before removing the portion of the first dislocation.

3. The method of claim 1, further comprising:
forming sidewall spacers adjoining sidewalls of the first gate stack and the second gate stack before forming the stress film.

4. The method of claim 1, wherein the depth D1 ranges from about 10 nanometers to about 150 nanometers.

5. The method of claim 1, wherein the source/drain feature is formed by epitaxially growing a SiGe layer.

6. The method of claim 1, wherein the second gate stack is PMOS gate stack.

7. The method of claim 1, wherein the first and the second amorphized regions are formed by performing an implantation process to implant the substrate with silicon (Si) or germanium (Ge) implant species.

8. The method of claim 7, wherein the implantation process includes utilizing an implantation dosage from about $1 \times 10^{14}$ atoms/cm$^2$ to about $2 \times 10^{15}$ atoms/cm$^2$.

9. The method of claim 1, wherein the process to form the first and the second dislocations is an annealing process performed by a rapid thermal annealing (RTA) process, at a temperature from about 400° C. to about 750° C., for a period of time from about 10 seconds to about 5 minutes.

10. The method of claim 1, wherein the process to form the dislocation is an annealing process performed by a spike rapid thermal annealing (RTA) process, at a temperature from about 990° C. to about 1050° C., for a period of time from about 0.1 seconds to about 2 seconds.

11. The method of claim 1, wherein the stress film is silicon nitride, silicon oxide, silicon oxynitride, or combinations thereof.

12. A method of manufacturing a semiconductor device, comprising:
forming a first gate stack and a second gate stack over a substrate, the substrate having a surface;
forming a first amorphized region in the substrate adjacent to an edge of the first gate stack, wherein the first amorphized region has a depth D1, and forming a second amorphized region in the substrate adjacent to an edge of the second gate stack, wherein the second amorphized region has a depth D1;
forming a stress film over the first and second amorphized regions;
performing an anneal process to form a first dislocation with a first pinchoff point in the substrate adjacent to the first gate stack and to form a second dislocation with a second pinchoff point in the substrate adjacent to the second gate stack, the first dislocation forming an angle $\theta 1$ measured with respect to a reference level orthogonal to the surface of the substrate, the first pinchoff point being spaced from the edge of the first gate stack by a distance W and having a depth D2 relative to the surface of the substrate;
removing at least a portion of the second dislocation to form a recess cavity adjacent to the second gate stack with a tip in the substrate, while leaving the first dislocation intact, the recess cavity having a depth D3 relative to the surface of the substrate and being spaced from the edge of the second gate stack by a distance S; and
forming a source/drain feature in the recess cavity; and
wherein a correlation satisfies the formula, $W>|D2-D3|*\tan(\theta 1)+S$.

13. The method of claim 12, further comprising:
removing a portion of the stress film over the substrate adjacent to the second gate stack before removing the second dislocation, while leaving another portion of the stress film to form spacers adjoining sidewalls of the second gate stack.

14. The method of claim 13 wherein the portion of the stress film adjacent to the first gate stack is not removed by the step of removing the portion of the stress film over the substrate adjacent to the second gate stack.

15. The method of claim 12, wherein the first gate stack is an NMOS gate and the second gate stack is a PMOS gate.

16. The method of claim 12, wherein the source/drain feature is formed by epitaxially growing a SiGe layer.

17. The method of claim 16, further comprising:
epitaxially growing a capping layer over the SiGe layer.

18. The method of claim 12, wherein the stress film has a thickness ranging from about 100 angstroms to about 300 angstroms.

19. The method of claim 12, wherein the anneal process is performed by a rapid thermal annealing (RTA) process, at a temperature from about 400° C. to about 750° C., for a period of time from about 10 seconds to about 5 minutes.

20. The method of claim 12, wherein anneal process performed by a spike rapid thermal annealing (RTA) process, at a temperature from about 990° C. to about 1050° C., for a period of time from about 0.1 seconds to about 2 seconds.

* * * * *